United States Patent
Mori et al.

(10) Patent No.: US 8,208,270 B2
(45) Date of Patent: Jun. 26, 2012

(54) SUBSTRATE JOINING MEMBER AND THREE-DIMENSIONAL STRUCTURE USING THE SAME

(75) Inventors: Masato Mori, Osaka (JP); Daido Komyoji, Nara (JP); Koichi Nagai, Kyoto (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 978 days.

(21) Appl. No.: 12/280,434

(22) PCT Filed: Apr. 23, 2007

(86) PCT No.: PCT/JP2007/058709
§ 371 (c)(1),
(2), (4) Date: Aug. 22, 2008

(87) PCT Pub. No.: WO2007/125849
PCT Pub. Date: Nov. 8, 2007

(65) Prior Publication Data
US 2009/0009979 A1 Jan. 8, 2009

(30) Foreign Application Priority Data
Apr. 27, 2006 (JP) ................................. 2006-123200

(51) Int. Cl.
*H05K 1/11* (2006.01)
(52) U.S. Cl. ......... 361/792; 361/770; 361/790; 361/795
(58) Field of Classification Search .................. 361/770, 361/790, 792–795
See application file for complete search history.

(56) References Cited

U.S. PATENT DOCUMENTS

| | | | | |
|---|---|---|---|---|
| 4,558,397 | A | * | 12/1985 | Olsson .......................... 361/772 |
| 5,040,994 | A | * | 8/1991 | Nakamoto et al. ........... 439/76.1 |
| 6,493,240 | B2 | * | 12/2002 | Broglia et al. ................. 361/803 |
| 2005/0168961 | A1 | | 8/2005 | Ono et al. |
| 2005/0260867 | A1 | | 11/2005 | Ono et al. |

FOREIGN PATENT DOCUMENTS

| | | |
|---|---|---|
| JP | 2-120848 | 9/1990 |
| JP | 5-152703 | 6/1993 |
| JP | 6-164097 | 6/1994 |
| JP | 2001-210954 | 8/2001 |
| JP | 2005-251889 | 9/2005 |

* cited by examiner

Primary Examiner — Tuan T Dinh
(74) Attorney, Agent, or Firm — McDermott Will & Emery LLP

(57) ABSTRACT

Three-dimensional structure (40) of the present invention includes first module board (28), second module board (37), and substrate joining member (10) that unifies board (28) and board (37) into one body, thereby electrically connecting these two elements together. The unification is done by molding the outer wall of housing (12) of substrate joining member (10) with resin (29). Substrate joining member (10) used in the three-dimensional structure (40) includes multiple lead terminals (14) made of conductive material, and a frame-shaped and insulating housing (12) to which frame the lead terminals (14) are fixed vertically in a predetermined array. Housing (12) includes projections (18) on at least two outer wall faces of its frame shape.

13 Claims, 9 Drawing Sheets

SUBSTRATE JOINING MEMBER AND THREE-DIMENSIONAL STRUCTURE USING THE SAME

RELATED APPLICATIONS

This application is the U.S. National Phase under 35 U.S.C. §371 of International Application No. PCT/JP2007/058709, filed on Apr. 23, 2007, which in turn claims the benefit of Japanese Application No. 2006-123200, filed on Apr. 27, 2006, the disclosures of which Applications are incorporated by reference herein.

TECHNICAL FIELD

The present invention relates to a substrate joining member for connecting multiple boards together, to which semiconductor elements (hereinafter referred to as IC chips) and chip components are mounted, and it also relates to a three-dimensional structure using the same substrate joining member.

BACKGROUND ART

Boards such as module boards, on which IC chips and chip components are mounted, have been conventionally connected to each other by a substrate joining member. The substrate joining member includes a multi-pole connector formed of a plug and a socket, or a pin connector formed of multiple connecting pins fixed to a spacer made of resin.

Meanwhile mobile devices have been downsized, light-weighted and yet sophisticated, which increases the number of connecting terminals between module boards while a pitch between each one of the connecting terminals becomes narrower. The substrate joining member thus needs to be downsized so that an area per pin can be desirably smaller.

However, the foregoing connecting structure tends to subject a connected section of the pin connector to great force when a change in temperature causes the members forming this connected section to change differently in dimensions or when this connected section receives external impact. Thus a structure for easing such external force has been studied.

For instance, use of pin connector 130 shown in FIGS. 10A and 10B for connecting module boards 110 and 120 together as shown in FIG. 11 allows easing stress produced by thermal expansion of resin spacer 132. This is disclosed in patent document 1. FIG. 10A shows a plan view of conventional pin connector 130, and FIG. 10B shows a sectional view cut along a longitudinal direction of pin connector 130. FIG. 11 shows a sectional view illustrating module boards 110 and 120 coupled together with pin connector 130. Resin spacer 132 of this pin connector 130 includes multiple metal connecting pins 134 vertically extending through spacer 132. Pins 134 are insert-molded together with resin spacer 132, thereby being fixed to spacer 132. On top of that, as shown in FIG. 10B, pin connector 130 is provided with resilient legs 136 slantingly protruding from its underside at both ends.

As shown in FIG. 11, module boards 110 and 120 are connected with this pin connector 130. To be more specific, metal connecting pin 134 extends through circuit patterns 114 and 124 at its upper end and lower end, then the upper end of pin 134 is soldered with circuit pattern 124, and the lower end of pin 134 is soldered with circuit pattern 114, thereby forming soldered sections 128. At this time, module board 110 at lower side is brought into contact with and fixed to resilient legs 136 provided to the underside of spacer 132.

If resin spacer 132 of pin connector 130 thermally expands due to the heat generated by electronic components 116, 126 or a change in ambient temperature, the stress due to these heat and changes can be absorbed by resilient legs 136. As a result, soldered section 128 incurs no stress even if components generate heat, so that a stable soldered condition can be maintained. Resilient legs 136 can be provided also to the top face of spacer 132 in addition to the underside thereof.

Connection between a hybrid integrated circuit and a base circuit board employs a rectangular parallelepiped and heat resistant resin into which perimeter a number of U-shaped conductors are inserted at given intervals, so that the hybrid integrated circuit is electrically and mechanically coupled to the base circuit board. A lead-array terminal formed of these U-shaped conductors contacts with a land electrode of the base circuit board, and at this contacting place, a soldered section and a non-soldered section are defined by a step. When force is applied vertically to the base circuit board, the foregoing structure allows the non-soldered section to be bent with ease at the step, so that the force can be absorbed, thereby preventing the soldered section from receiving excessive stress (e.g. refer to patent document 2).

When another circuit board is fixed to the base circuit board with an external connecting lead wire, a tip of this lead wire is bent to be resilient. This is an improvement. This resilient section can absorb the distortion due to a difference in thermal expansion coefficients between this another circuit board and the base circuit board, so that both of the circuit boards can be coupled together in a good condition (e.g. refer to patent document 3).

The mobile devices have been sophisticated conspicuously in recent years, so that the number of connecting terminals of connectors has continued to increase while the mobile devices are required to be tougher against drop impact. The connecting structure by using pin connectors discussed above provides through holes to a module board, and the connecting pins extend through these holes, so that the module board is connected to a circuit pattern. On top of that, the resilient legs absorb thermal stress. This structure, however; uses both sides of the module board inefficiently, and the presence of through holes constrains the board from increasing a density of the circuit pattern.

The market expects that a circuit pattern be of a higher density and a lead shape be smaller, so that simple tricks such as a modification of a connecting lead-wire terminal are not enough to dampen the stress.

Patent Document 1: Unexamined Japanese Patent Publication No. H06-310195
Patent Document 2: Japanese Utility Model Publication No. H05-55575
Patent Document 3: Japanese Utility Model Publication No. H01-86268

DISCLOSURE OF INVENTION

The present invention addresses the problems discussed above, and aims to provide a substrate joining member capable of connection with a fine pitch and maintaining reliability at its connecting section when stress such as drop impact is applied to the substrate joining member. The present invention also provides a three-dimensional structure using the same substrate joining member.

The substrate joining member of the present invention includes a plurality of lead terminals made of electrically conductive material and an insulating housing to which the multiple lead terminals are fixed in a predetermined array. Each one of the lead terminals includes an upper end connecting section at a top face of the housing and a lower end connecting section at an underside of the housing. The housing includes a projection on at least two faces of its outer wall. This structure allows a three-dimensional structure connected with this substrate joining member to bear large impact because two boards and the substrate joining member unified into one body as a whole receive the impact. The three-dimensional structure is thus free from locally focused stress, so that it increases shock resistance. As a result, the three-dimensional structure excellent in shock resistance is obtainable although it employs fine-pitch connection.

Figure 1A:
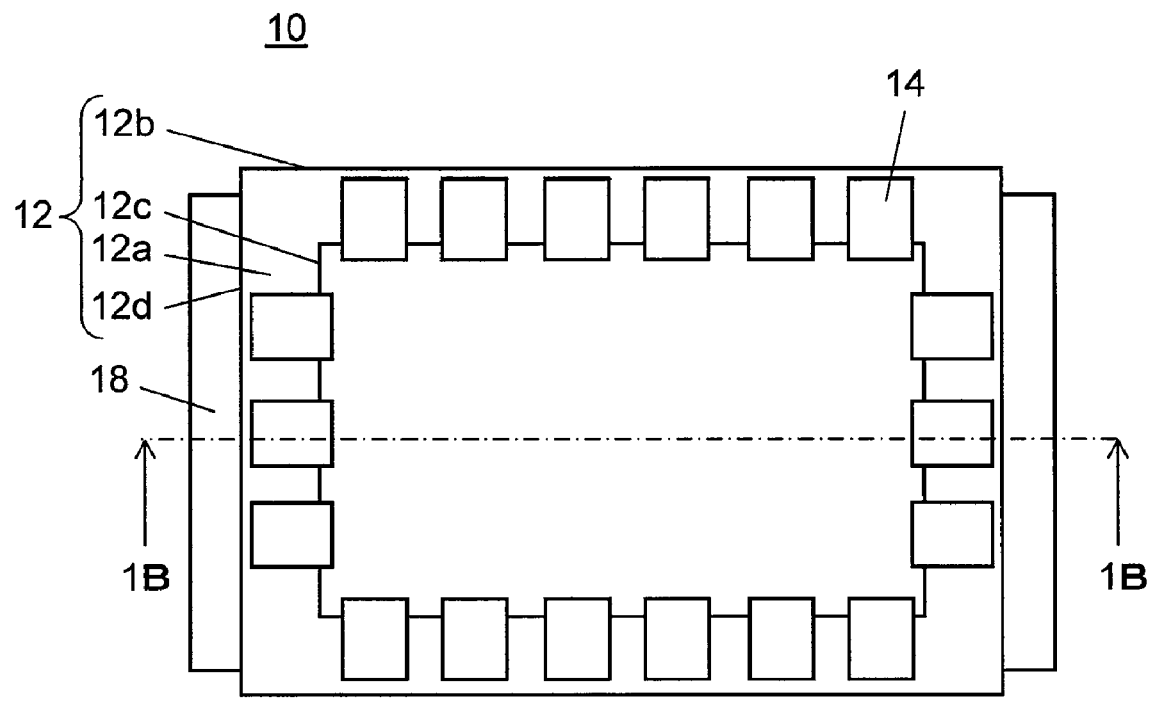
FIG. 1A shows a top view of a substrate joining member in accordance with an embodiment of the present invention.

DESCRIPTION OF REFERENCE MARKS 10 substrate joining member
12, 59 housing
12a, 63 top face
12b, 64 underside
12c inner wall
12d, 61 outer wall face
14 lead terminal
15 upper end connecting section
16 lower end connecting section
17 lead connecting section
18, 62, 37, 73 projection
20 multi-layer wiring board
23, 24, 32, 33, 114, 124 circuit pattern
25, 34 penetrating conductor
26, 27, 35, 36, 116, 126 electronic component
28 first module board
29 resin
30 double-sided wiring board
37 second module board
39, 41, 58 solder
40, 50, 55, 60, 65, 70, 75, 80, 85 three-dimensional structure
51, 52, 53, 54 shielding member
56, 57 grounding terminal
66 tip
68 intermediate section
71 region
72, 74, 76 hole
110, 120 module board
112, 122 wiring board
128 soldered section
130 pin connector
132 resin spacer
134 metal connecting pin
136 resilient leg

PREFERRED EMBODIMENTS OF THE INVENTION

Exemplary embodiments of the present invention are demonstrated hereinafter with reference to the accompanying drawings, in which a dimension along a thickness direction is enlarged in order to illustrate the structure more understandable. Elements similar to those in other embodiments have the same reference marks, and the descriptions thereof are sometimes omitted.

Embodiment 1

Figure 1B:
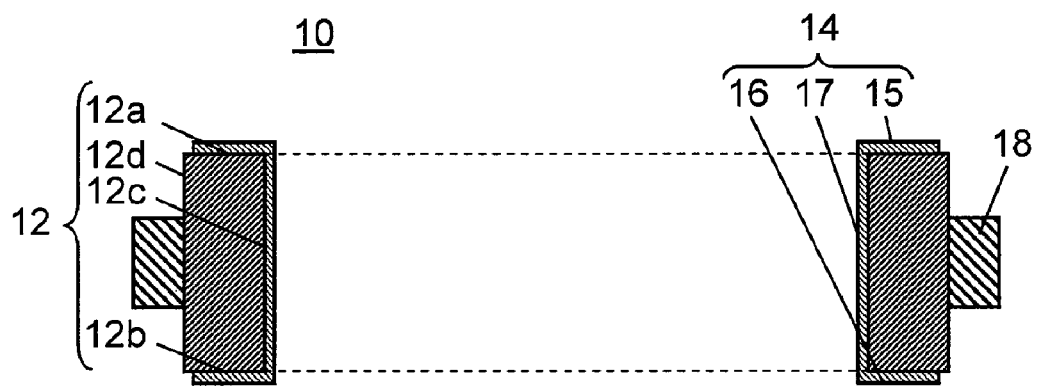
FIG. 1B shows a sectional view of the substrate joining member cut along line 1B-1B in FIG. 1A.

FIG. 1A shows a top view of substrate joining member 10 in accordance with the first embodiment of the present invention, and FIG. 1B shows a schematic sectional view of substrate joining member 10 shown in FIG. 1A cut along line 1B-1B.

As shown in FIG. 1A, substrate joining member 10 includes a plurality of lead terminals 14 made of electrically conductive material such as metal sheet and frame-like insulating housing 12 to which multiple lead terminals 14 are fixed vertically in a predetermined array. As shown in FIG. 1B, each one of lead terminals 14 is formed of upper end connecting section 15 disposed on top face 12a of housing 12, lower end connecting section 16 disposed on underside 12b of housing 12, and lead connecting section 17 disposed on inner wall 12c.

Housing 12 includes projections 18 formed on at least two faces 12d of its outer wall of the frame-like housing 12. Housing 12 is made from resin such as liquid crystal polymer, polyphenylene sulfide, polybutylene terephthalate, and its sectional view forms an envelope-like rectangular including the space defined with broken lines as shown in FIG. 1B.

Figure 2:
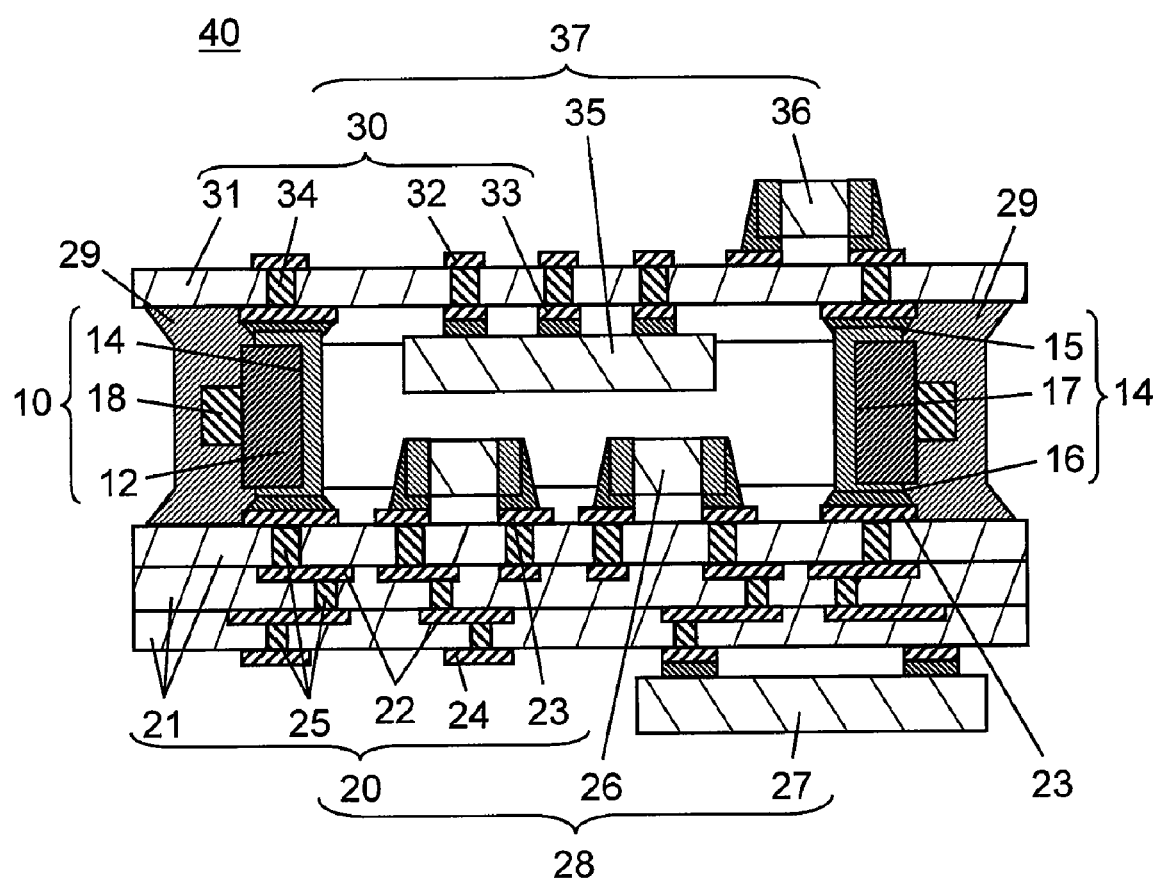
FIG. 2 shows a sectional view of a three-dimensional structure in accordance with an embodiment of the present invention.

Substrate joining member 10 is constructed as discussed above, and its upper end connecting section 15 and lower end connecting section 16 are disposed on planes typically parallel to each other. Respective module boards as shown in FIG. 2, for instance, are coupled together mechanically and electrically with foregoing substrate joining member 10.

Lead terminal 14 can made of phosphor bronze, brass, copper-nickel-zinc alloys, beryllium bronze, nickel alloy, stainless steel, or spring steel, and is preferably made of well-conductive material such as copper or nickel. A shape of lead terminal 14 is not limited to a plate-like form shown in FIGS. 1A and 1B, but it can be circular in sectional view. A width and a thickness of lead terminal 14 can be set appropriately in response to a material to be used and a pitch of array.

When the circuit patterns of respective modules are connected to lead terminal 14 with solder, it is preferable to plate at least upper end connecting section 15 and lower end connecting section 16 of lead terminal 14 with solder or gold at their surfaces so that they can be soldered with ease. The circuit pattern can be connected to lead terminal 14 with conductive adhesive. In this case, it is preferable to plate the surface of lead terminal 14 with gold, so that a smaller connecting resistance can be expected.

In the case of using substrate joining member 10 in accordance with this first embodiment for connecting two module boards together, and also when the space surrounded by the two boards and outer wall faces 12d where projections 18 formed are filled with resin, projections 18 are fit into the resin, so that the two module boards and substrate joining member 10 are unified into one body and firmly connected together. A three-dimensional structure thus formed can receive impact as a whole one body, so that a connected section with solder, for instance, can be free from locally focused impact. As a result, great impact such as a drop shock does not incur damage to the connected sections, and a highly reliable three-dimensional structure is thus obtainable.

The three-dimensional structure by using substrate joining member 10 in accordance with this first embodiment for connecting boards to each other is demonstrated hereinafter with reference to FIG. 2. FIG. 2 shows a sectional view illustrating three-dimensional structure 40 cut along the center line of substrate joining member 10. In this first embodiment, two boards to which multiple electronic components are mounted are connected together with substrate joining member 10, and the two boards are referred to as first module board 28 and second module board 37 hereinafter.

First module board 28 has the following construction: multilayer wiring board 20 is mounted with electronic components 26, 27 such as IC chips or chip components thereon. Multilayer wiring board 20 is formed of multiple resin boards 21, interlayer wiring patterns 22, circuit patterns 23, 24 formed on both sides of multilayer wiring board 20, and penetrating conductors 25 for connecting these elements.

Second module board 37 is formed of double-sided wiring board 30, and electronic components 35, 36 such as IC chips and chip components mounted on board 30. Double-sided wiring board 30 includes circuit patterns 32, 33 formed on both sides of board 30, and penetrating conductors 34 for connecting these elements.

One of circuit patterns 23 formed on first module board 28 is selected due to its position confronting lower end connecting section 16 of lead terminal 14 of substrate joining member 10, and one of circuit patterns 33 formed on second module board 37 is selected due to its position confronting upper end connecting section 15 of lead terminal 14. These two selected circuit patterns are soldered to lower end connecting section 16 and upper end connecting section 15 respectively, so that a three-dimensional structure can be formed. In other words, a part of circuit patterns 23 is electrically connected to a part of circuit patterns 33 through lead terminal 14 by soldering at upper end connecting section 15 and lower end connecting section 16. These two parts confront each other via lead terminal 14.

Use of substrate joining member 10 allows mounting electronic components 26 and 35, as shown in FIG. 2, to top face of first module board 28 and underside of second module board 37 inside inner wall 12c of substrate joining member 10.

In three-dimensional structure 40 shown in FIG. 2, circuit pattern 23 of first module board 28 is soldered to lower end connecting section 16 of substrate joining member 10. Since lower end connecting section 16 is formed solidly on bottom face 12b of housing 12, first module board 28 is fixedly unified with substrate joining member 10. Circuit pattern 33 of second module board 37 is soldered to upper end connecting section 15 of substrate joining member 10. After these soldering steps, resin 29 is filled into the outside of outer wall faces 12d of housing 12, so that projections 18 on outer wall faces 12d are firmly fit into resin 29. Thus first module board 28, second module board 37, and substrate joining member 10 can be unified into one body, which resultantly forms a three-dimensional structure 40.

The foregoing connection mechanism allows three-dimensional structure 40 as a whole one body to receive great impact such as a drop shock, and a connected section with solder can be free from locally focused impact. As a result, great impact such as a drop shock does not incur damage to connected sections, and a highly reliable three-dimensional structure is thus obtainable.

Three-dimensional structure 40 in accordance with the first embodiment employs a multilayer wiring board as first module board 28, and a double-sided wiring board as second module board 37; however, the present invention is not limited to this example. For instance, both of the module boards can be double-sided wiring boards or both of the module boards can be multilayer wiring boards. On the other hand, one of the module boards can be a flexible wiring board.

A method of manufacturing three-dimensional structure 40 is demonstrated hereinafter with reference to FIGS. 3A-3D. First, as shown in FIG. 3A, second module board 37 formed of double-sided wiring board 30, on which electronic component 35 is mounted, is soldered with solder 39 available on circuit pattern 33 to upper end connecting section 15 of substrate joining member 10 at the top face of circuit pattern 33.

Figure 3A:
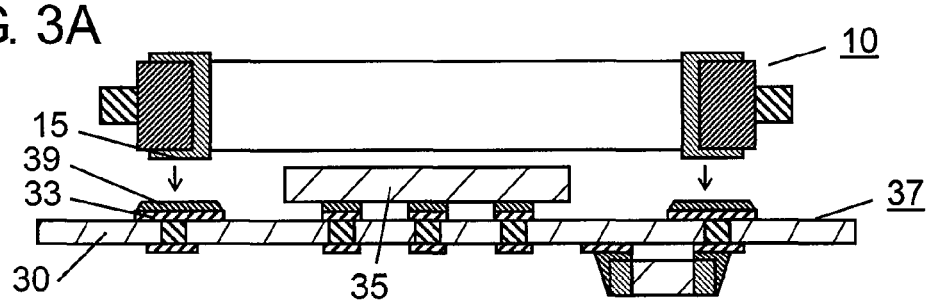
FIG. 3A shows a sectional view illustrating a step of manufacturing the three-dimensional structure in accordance with an embodiment of the present invention.
Figure 3B:
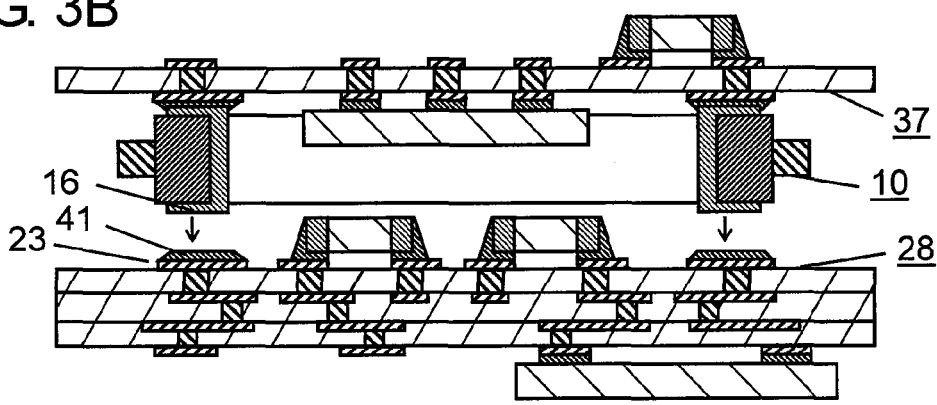
FIG. 3B shows a sectional view illustrating another step of manufacturing the three-dimensional structure in accordance with the embodiment of the present invention.

Next, as shown in FIG. 3B, second module board 37 and substrate joining member 10 unified into one body by the soldering step done as shown in FIG. 3A are turned over 180 degrees. Then lower end connecting section 16 of substrate joining member 10 is connected to circuit pattern 23 of first module board 28 with solder 41 available on circuit pattern 23, so that first module board 28, substrate joining member 10, and second module board 37 are unified into one body.

Figure 3C:
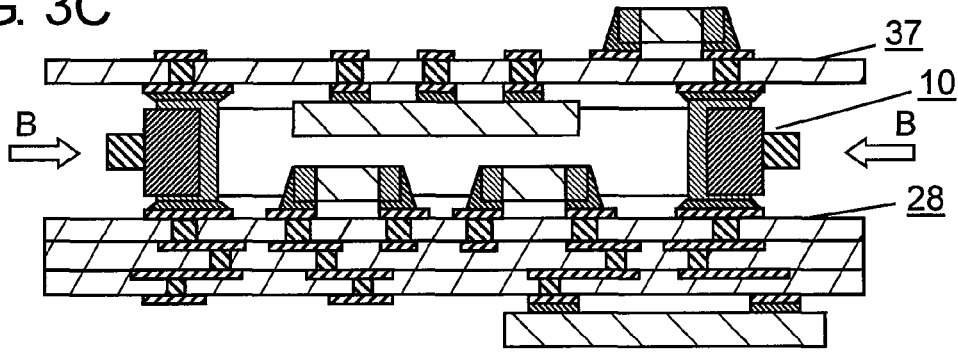
FIG. 3C shows a sectional view illustrating still another step of manufacturing the three-dimensional structure in accordance with the embodiment of the present invention.
Figure 3D:
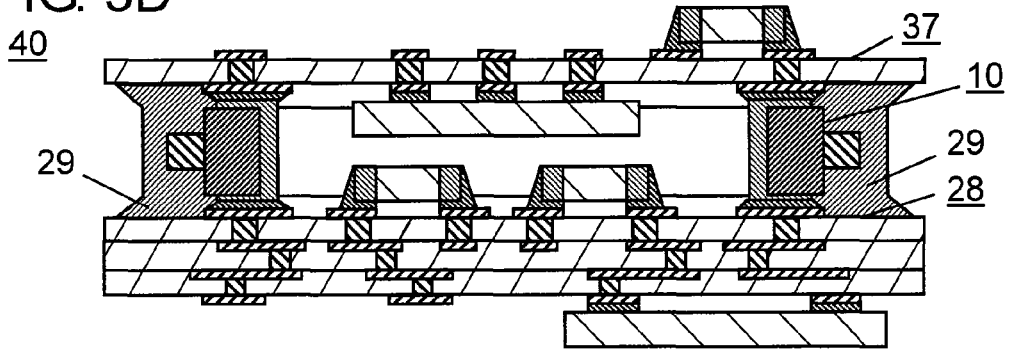
FIG. 3D shows a sectional view illustrating yet another step of manufacturing the three-dimensional structure in accordance with the embodiment of the present invention.

Then as shown in FIG. 3C, resin is filled onto outer wall faces 12d, on which projections 18 are available, along arrow marks B through a cylinder or a nozzle. As shown in FIG. 3D, first module board 28, second module board 37 and substrate joining member 10 are unified by the soldering and with resin 29 into one body, i.e. three-dimensional structure 40.

Figure 4A:
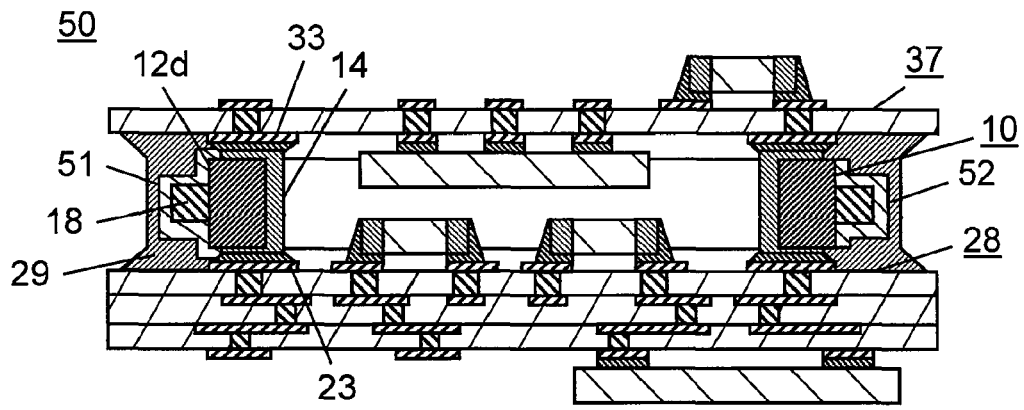
FIG. 4A shows a sectional view illustrating a three-dimensional structure, in which a shielding member is formed, in accordance with an embodiment of the present invention.
Figure 4B:
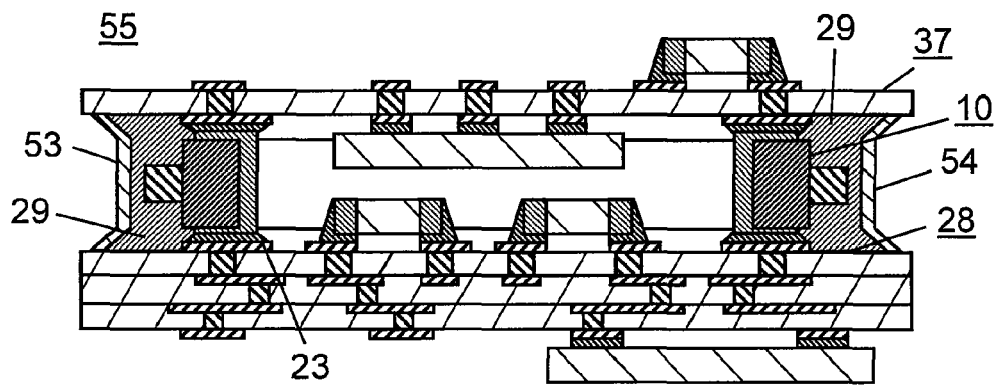
FIG. 4B shows a sectional view illustrating a three-dimensional structure, in which a shielding member is formed, in accordance with an embodiment of the present invention.
Figure 4C:
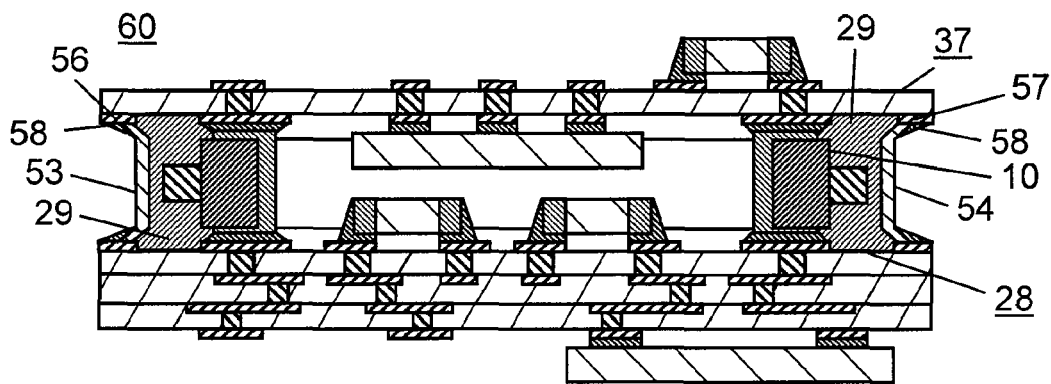
FIG. 4C shows a sectional view illustrating a three-dimensional structure, in which a shielding member is formed, in accordance with an embodiment of the present invention.

Next, a shielding structure is demonstrated with reference to FIGS. 4A-4C which show sectional views of the three-dimensional structure in which a shielding member is formed for shielding unnecessary electromagnetic wave generated by the circuits built inside the substrate joining member of the three-dimensional structure.

FIG. 4A shows a sectional view of three-dimensional structure 50, in which conductive shielding member 51 including projection 18 is formed on outer wall face 12d at the left side of substrate joining member 10. Shielding member 51 is formed of, e.g. silver foil stuck solidly onto entire outer wall face 12d of substrate joining member 10, and is connected to circuit patterns 33, 23 (upper and lower circuit patterns) through one of lead terminals 14 as shown in FIG. 4A. The silver foil is stuck onto face 12d separately so as not to connect to other lead terminals (not shown) than lead terminals 14 shown in FIG. 4A.

On the right side of substrate joining member 10, conductive shielding member 52 including projection 18 is formed on entire outer wall face 12d similar to that on the left side. Shielding member 52 is stuck solidly onto entire face 12d, and separately so as not to connect to other multiple lead terminals (not shown). Although it is not shown here, shielding members 51 and 52 are continuous, and the silver foil is stuck onto entire four faces of the outer wall of substrate joining member 10. Shielding members 51 and 52 covering the entire outer wall of substrate joining member 10 are connected only to lead terminals 14 shown in FIG. 4A, and is connected to a grounding terminal (not shown here) via circuit patterns 33 and 23 connected to lead terminal 14.

The foregoing structure allows shielding unnecessary electromagnetic wave produced by circuits built inside substrate joining member 10 so as not to adversely affect the outside. At the same time, this shielding can prevent external electromagnetic wave from adversely affecting the circuit built inside substrate joining member 10.

A grounding terminal (not shown) can be provided at the same position as the lower end connecting section (not shown in FIG. 4) of lead terminal 14 to which shielding members 51 and 52 are connected, or this lead terminal 14 can be formed as a grounding terminal and shielding members 51 and 52 can be connected to this terminal. In other words, this grounding terminal is connected electrically to the ground, thereby obtaining the shielding effect similar to what is discussed previously.

Foregoing shielding members 51 and 52 shield the interior (not shown) of substrate joining member 10 from electromagnetic wave, so that if electronic components vulnerable to external noises are mounted to a module board placed in this interior, the external noises are shielded. Three-dimensional structure 50 can thus prevent noises more positively with this electromagnetic shielding structure.

Next, another shielding instance is demonstrated, i.e. the shielding is provided not to the outer wall of substrate joining member 10 but to the exterior of resin 29 filled to three-dimensional structure 55. FIG. 4B shows a sectional view of three-dimensional structure 55, where conductive shielding members 53 and 54 are formed on the exterior of resin 29 filled in both sides of substrate joining member 10. Conductive shielding member 53 and 54 can be formed by painting copper or carbon paste to the exterior of resin 29, and then hardening the paste. Although it is not shown in FIG. 4B, shielding members 53 and 54 are grounded through the ground-wirings of first module board 28 and second module board 37, thereby enhancing the effectiveness of electromagnetic shielding.

FIG. 4C shows a sectional view of three-dimensional structure 60 to which grounding terminals 56 and 57 are provided in advance for connecting shielding members 53 and 54 to first and second module boards 28 and 37. Shielding members 53 and 54 can be soldered with solder 58 to first and second module boards 28 and 37, so that more stable mechanical and electrical connection can be expected.

The structure shown in FIG. 4B or FIG. 4C allows shielding the interior of substrate joining member 10 used in three-dimensional structure 55 or 60 from electromagnetic wave. If electronic components vulnerable to external noises are mounted to a module board placed in this interior, the external noises are shielded. Three-dimensional structures 55 and 60 can thus prevent noises more positively with this electromagnetic shielding structure.

Embodiment 2

Figure 5:
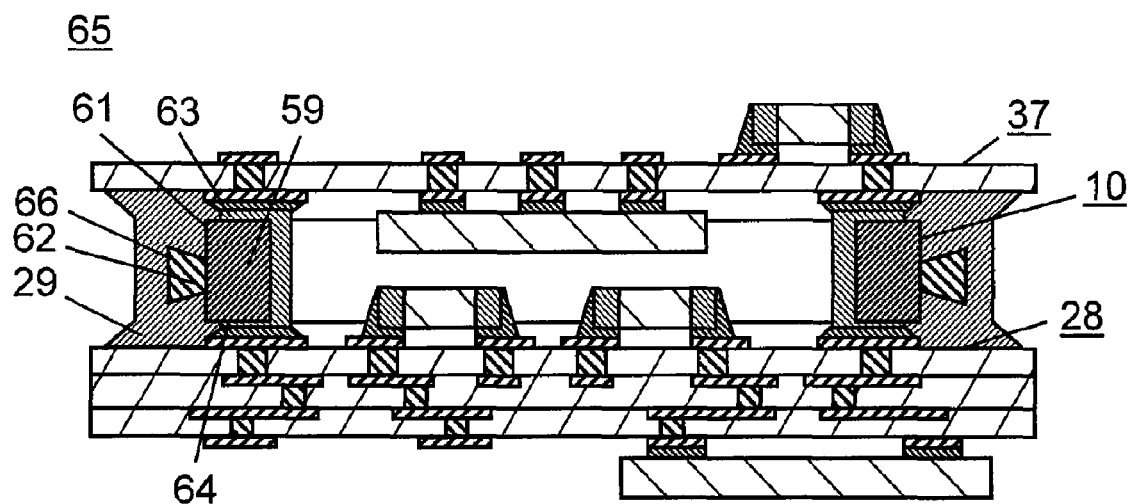
FIG. 5 shows a sectional view of a three-dimensional structure in accordance with an embodiment of the present invention.
Figure 6:
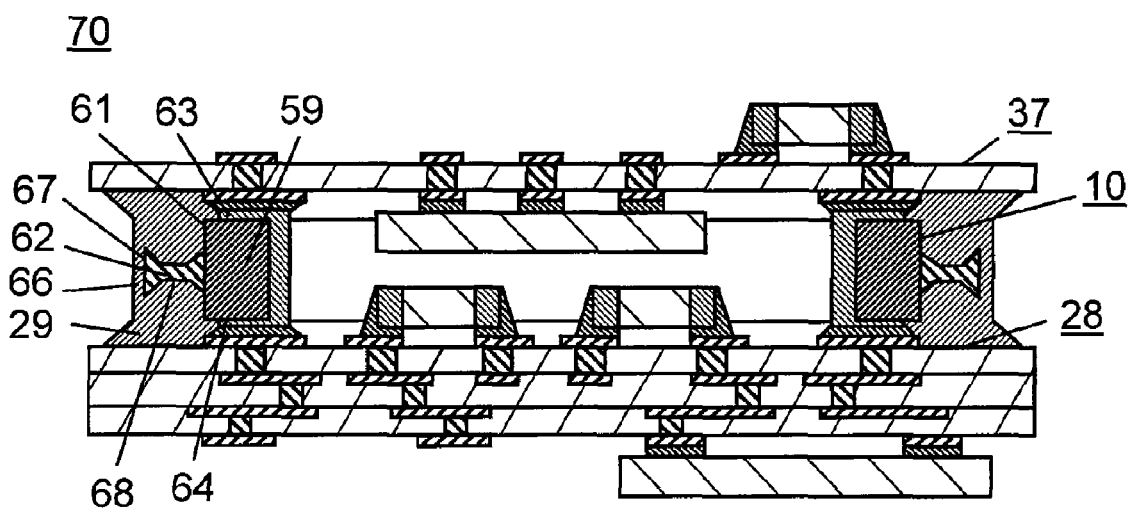
FIG. 6 shows a sectional view of a three-dimensional structure in accordance with an embodiment of the present invention.

FIGS. 5 and 6 show sectional views of a three-dimensional structure in accordance with the second embodiment of the present invention. The second embodiment differs from the first embodiment in a shape of the projection of the substrate joining member. This modification of the projection allows the projection to be fit more firmly into the resin filled-in. Other structures remain the same as those in the first embodiment.

FIG. 5 shows a sectional view of three-dimensional structure 65, which employs substrate joining member 10 equipped with projections 62 on outer wall face 61. The cross section of projections 62 viewed from vertical direction with respect to top face 63 and underside 64 of housing 59 shows that each one of projections 62 tapers from its tip 66 toward outer wall face 61. First and second module boards 28, 37 are unified into one body with substrate joining member 10 and resin 29, so that tapering projection 62 allows reinforcing the fit between projection 62 and resin 29. As a result, the unification of three-dimensional structure 65 can be reinforced.

FIG. 6 shows a sectional view of three-dimensional structure 70 which embodies another instance of reinforcing the unification. Structure 70 employs substrate joining member 10 equipped with projections 67 on outer wall surface 61. The cross section of projections 67 viewed from the vertical direction with respect to top face 63 and underside 64 of housing 59 shows that each one of projections 67 has at least one section slimmer than its tip 66 between outer wall face 61 and tip 66. Substrate joining member 10 and resin 29 unify first module board 28 and second module board 37 into one body, so that intermediate section 68 between tip 66 and outer wall face 61 is formed slimmer than tip 66, thereby reinforcing the fit of projection 67 into resin 29. As a result, the unification of three-dimensional structure 70 can be reinforced.

The cross section of the projection viewed from the horizontal direction with respect to the top face and the underside of the housing can show that the projection tapers from its tip toward the outer wall. In the same way, the cross section of the projection viewed from the horizontal direction with respect to the top face and the underside of the housing can show that the projection has at least one section slimmer than its outer wall side between the outer wall face and the tip. These shapes of projections can also reinforce the fit of the projections into the resin, and the unification of the three-dimensional structure can be reinforced.

Embodiment 3

Figure 7:
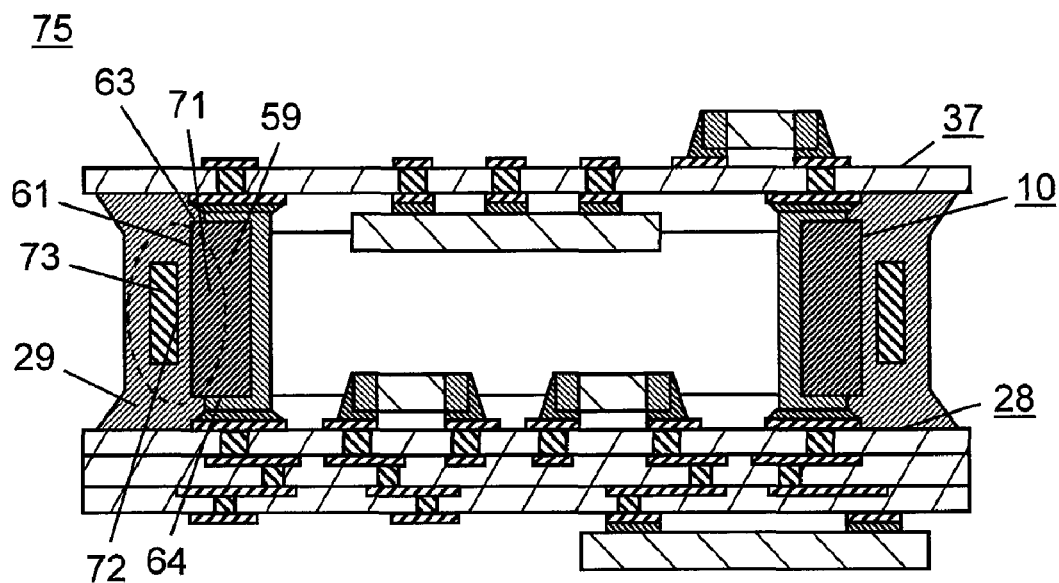
FIG. 7 shows a sectional view of a three-dimensional structure in accordance with an embodiment of the present invention.
Figure 8:
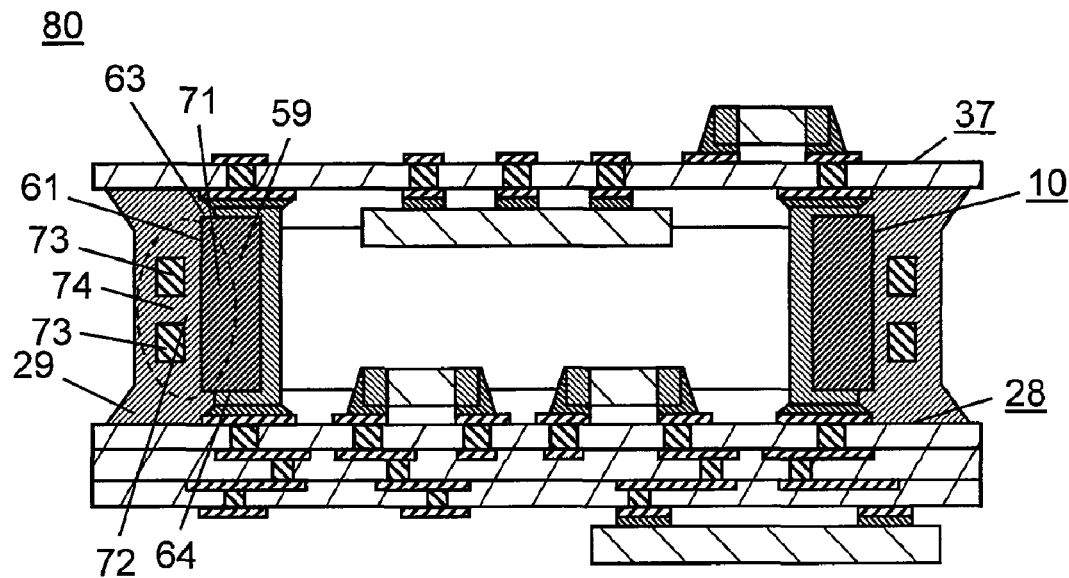
FIG. 8 shows a sectional view of a three-dimensional structure in accordance with an embodiment of the present invention.
Figure 9:
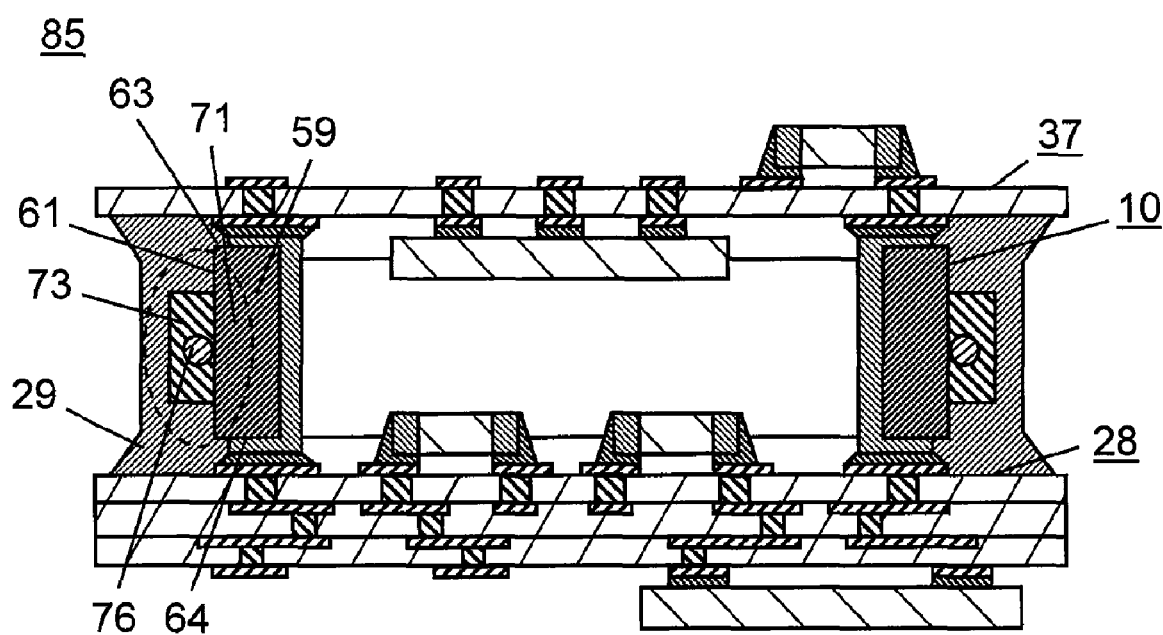
FIG. 9 shows a sectional view of a three-dimensional structure in accordance with an embodiment of the present invention.
Figure 10A:
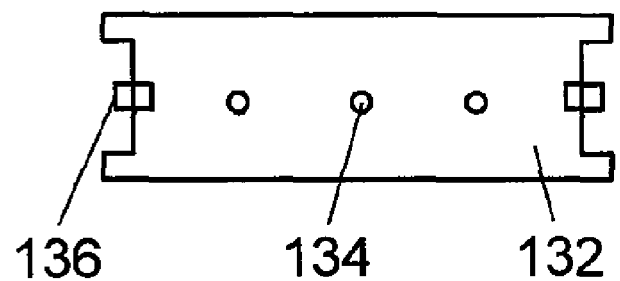
FIG. 10A shows a plan view of a conventional pin connector.
Figure 10B:
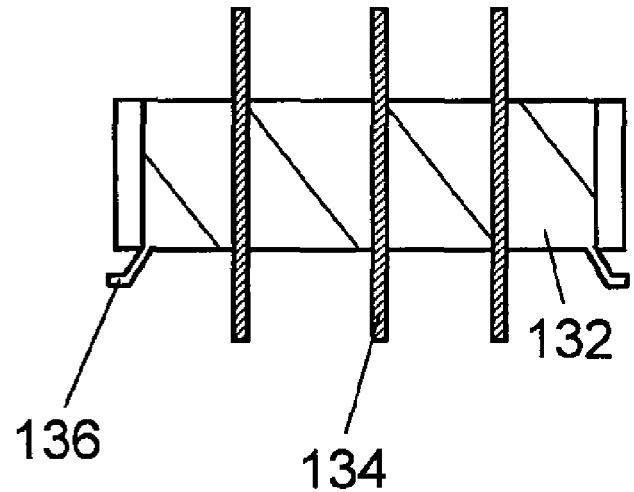
FIG. 10B shows a sectional view of the conventional pin connector shown in FIG. 10A cut along a longitudinal direction of the pin connector.
Figure 11:
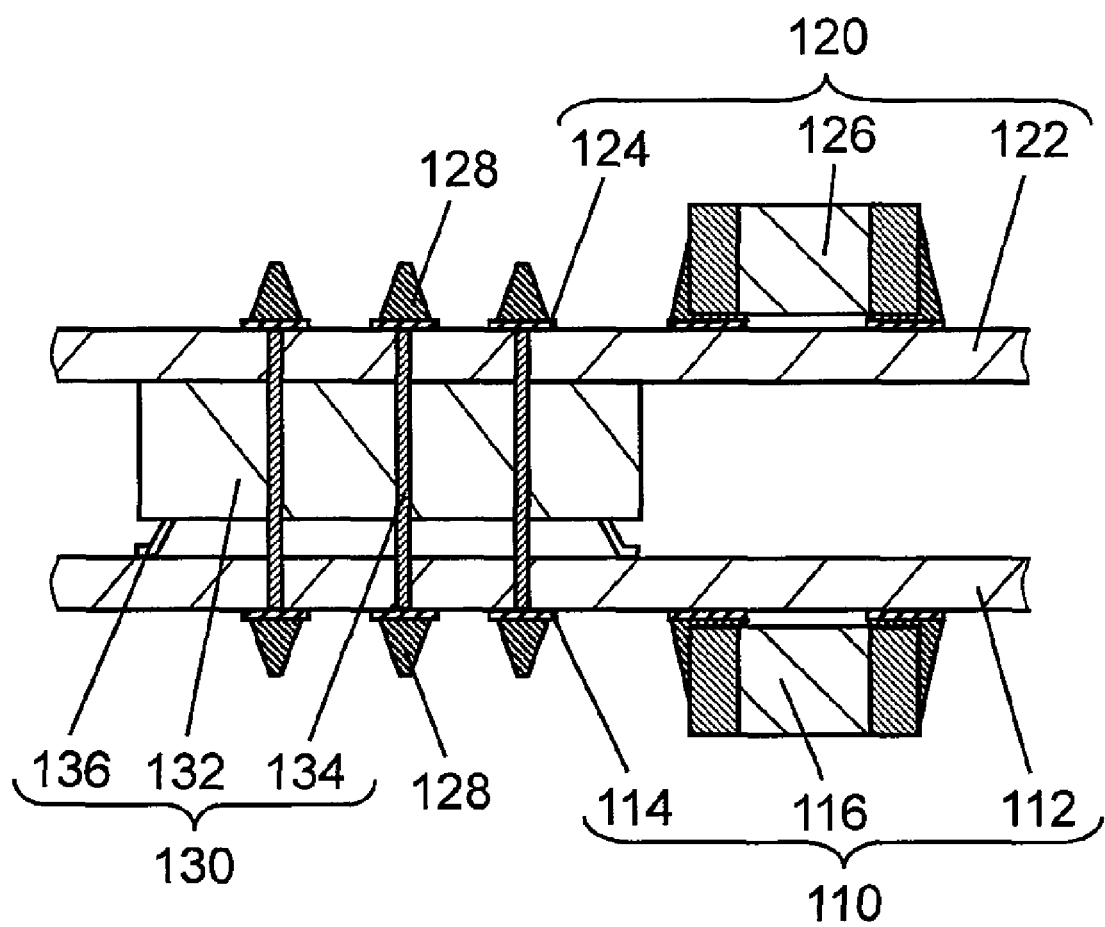
FIG. 11 shows a sectional view illustrating a connection between two module boards with the pin connector shown in FIG. 10A.

FIGS. 7-9 show sectional views of three-dimensional structures in accordance with the third embodiment of the present invention. In this third embodiment, a hole is formed in a region between the housing and the projection, and the hole is filled with resin, so that the projection can be fit into the resin more firmly. Other structures remain unchanged from those in the first embodiment.

FIG. 7 shows a sectional view of three-dimensional structure 75, which includes through-hole 72 in region 71 between projection 73 and housing 59. Hole 72 is formed vertically with respect to top face 63 and underside 64 of substrate joining member 10. Substrate joining member 10 having the structure discussed above connects first module board 28 and second module board 37 together, and outer wall face 61 surrounds the connected unit. Resin 29 is filled into the space outside the outer wall face 61, and then though-hole 72 vertically formed in region 71 is also filled with resin 29. This structure allows projection 73 formed on outer wall face 61 to be fit into resin 29 more firmly. As a result, first module board 28, second module board 37 and substrate joining member 10 can be connected more firmly.

FIG. 8 shows a sectional view of three-dimensional structure 80 which includes a horizontal hole in region 71 in addition to the vertical hole discussed above. In structure 80, hole 74 is formed horizontally with respect to top face 63 and underside 64 of housing 59 besides through-hole 72 vertically formed in region 71. This hole 74 thus formed runs vertically with respect to outer wall face 61 and reaches through-hole 72.

Substrate joining member 10 having the structure discussed above connects first module board 28 and second module board 37 together, and outer wall face 61 surrounds the connected unit. Resin 29 is filled into the space outside the outer wall face 61, and thus vertical hole 72 and horizontal hole 74 are also filled with resin 29. This structure allows projections 73 to be fit into resin 29 more firmly than projections 73 shown in FIG. 7. As a result, first module board 28, second module board 37 and substrate joining member 10 can be connected still more firmly.

FIG. 9 shows a sectional view of three-dimensional structure 85 having through-hole 76 in region 71. Hole 76 is formed horizontally with respect to top face 63 and underside 64 of housing 59, and also extends through horizontally with respect to outer wall face 61. Similar to the cases shown in FIGS. 7 and 8, substrate joining member 10 having the structure discussed above connects first and second module boards 28 and 37 together, and outer wall face 61 surrounds the connected unit. Resin 29 is filled into the space outside outer wall face 61, and thus through-hole 76 is also filled with resin 29, so that projections 73 can be fit into resin 29 more firmly. As a result, first module board 28, second module board 37 and substrate joining member 10 can be connected still yet more firmly.

The holes formed in region 71 shown in FIG. 7-FIG. 9 can be unidirectional ones, two-directional ones, or three-directional ones. The holes can be through-holes or holes having a bottom or an end.

The resin can be filled into the holes formed vertically or horizontally in the specified region, so that the projections formed on the outer wall face can be fit into the resin more firmly. As a result, the three-dimensional structure excellent in anti-shock properties is obtainable.

In the embodiments 1-3, the projections are formed on at least two outer wall faces; however, they can be formed on three faces or four faces. The projection per wall face is described as a bar-shape; however, it can be multiple bars in parallel to each other per wall face, or not limited to a bar-shape but the projection can be any three-dimensional form. The projection can be formed two-directionally and dispersed per wall face, and these two-directionally dispersed projections can be formed on three faces or four faces of the outer wall.

The substrate joining member does not necessarily form a square frame, but it can form a triangle, a pentagon or other polygons. It also can be a square including a rectangular, a regular square, or a complicated form such as a picture frame. Further, it can be a circular frame or an oval frame.

INDUSTRIAL APPLICABILITY

A substrate joining member and a three-dimensional structure using the same substrate joining member of the present invention allow connecting boards, on which electronic components are mounted, to each other with fine pitches, so that the anti-shock properties thereof can be greatly improved. The substrate joining member can be provided with a shielding function for shielding electronic components vulnerable to electromagnetic noises from electromagnetic waves. The present invention is thus useful in the field of portable electronic devices such as mobile devices.

The invention claimed is:

1. A three-dimensional structure comprising:
   a first module board;
   a second module board;
   a plurality of lead terminals made of electrically conductive material;
   an insulating housing shaped like a frame and having the plurality of lead terminals fixed thereto vertically in a predetermined array, and
   a substrate joining member electrically connects the first module board and the second module board together,
   wherein each one of the lead terminals includes an upper end connecting section at a top face of the housing and a lower end connecting section at an underside of the housing,
   the housing includes a projection on at least two faces of an outer wall of the frame shape,
   a circuit pattern formed on the first module board and another circuit pattern formed on the second module board are connected to an upper end connecting section and a lower end connecting section of a lead terminal of the substrate joining member at their places confronting the upper end connecting section and the lower end connecting section, and
   an outer wall face of a housing of the substrate joining member is molded with resin for unifying the first module board, the second module board and the substrate joining member into one body, and the surfaces of the projections not in contact with the outer wall are fully encapsulated by a resin.

2. The three-dimensional structure of claim 1, wherein a cross section of the projection viewed from a vertical direction with respect to the top face and the underside shows that the projection tapers from its tip toward the outer wall face.

3. The three-dimensional structure of claim 1, wherein a cross section of the projection viewed from a vertical direction with respect to the top face and the underside shows that the projection has a section slimmer than a tip of the projection at least at a position between the tip and the outer wall face.

4. The three-dimensional structure of claim 1, wherein the housing includes a through-hole extending through the projection vertically at a region including at least the outer wall face where the projection is formed.

5. The three-dimensional structure of claim 1, wherein the housing includes a through-hole extending through the projection at a region including at least the outer wall face where the projection is formed, the through-hole being formed horizontally with respect to the top face and the underside, and horizontally with respect to the outer wall face.

6. The three-dimensional structure of claim 1, wherein the housing includes a through-hole extending through the projection at a region including at least the outer wall face where the projection is formed, the through-hole being formed horizontally with respect to the top face and the underside, and vertically with respect to the outer wall face.

7. The three-dimensional structure of claim 1, wherein the housing includes an electrically conductive shielding member on the outer wall face where the projection is formed.

8. The three-dimensional structure of claim 1, wherein the shielding member is connected to a grounding terminal disposed at a similar place to the lower end connecting section of the lead terminals.

9. The three-dimensional structure of claim 1, wherein at least one of the lead terminals is used as a grounding terminal, which is connected to the shielding member.

10. The three-dimensional structure of claim 1 further comprising:
   an electrically conductive shielding member formed on an exterior of the resin.

11. The three-dimensional structure of claim 1, wherein the projections are made from an insulating material.

12. The three-dimensional structure of claim 1, wherein two faces of an outer wall of the frame shape face to each other.

13. The three-dimensional structure of claim 10, wherein the conductive shielding member is electrically connected to a grounding terminal of at least one of the first module board and the second module board.

* * * * *